United States Patent
Roth

(10) Patent No.: US 8,110,468 B2
(45) Date of Patent: Feb. 7, 2012

(54) DMOS-TRANSISTOR HAVING IMPROVED DIELECTRIC STRENGTH OF DRAIN AND SOURCE VOLTAGES

(75) Inventor: Andreas Roth, Erfurt-Urbrich (DE)

(73) Assignee: X-FAB Semiconductor Foundries AG, Erfurt (DE)

(*) Notice: Subject to any disclaimer, the term of this patent is extended or adjusted under 35 U.S.C. 154(b) by 473 days.

(21) Appl. No.: 11/662,356

(22) PCT Filed: Sep. 7, 2005

(86) PCT No.: PCT/DE2005/001567
§ 371 (c)(1),
(2), (4) Date: May 22, 2009

(87) PCT Pub. No.: WO2006/026974
PCT Pub. Date: Mar. 16, 2006

(65) Prior Publication Data
US 2009/0236661 A1 Sep. 24, 2009

(30) Foreign Application Priority Data
Sep. 8, 2004 (DE) .......................... 10 2004 043 284

(51) Int. Cl.
*H01L 29/66* (2006.01)
*H01L 21/336* (2006.01)
(52) U.S. Cl. ........ 438/286; 438/306; 257/335; 257/342; 257/E29.256
(58) Field of Classification Search .................. 257/343, 257/335, E29.261, 341, E29.027, 342, E29.256; 438/197, 286, 306
See application file for complete search history.

(56) References Cited

U.S. PATENT DOCUMENTS
7,635,621 B2 * 12/2009 McCormack et al. ........ 438/202
2002/0017683 A1 * 2/2002 Jeon .............................. 257/339

FOREIGN PATENT DOCUMENTS
EP 0 741 416 A1 11/1996

OTHER PUBLICATIONS
A.R. Alvarez, et al.; "Lateral DMOS Transistor Optimized for High Voltage BIMOS Applications"; International Electron Devices Meeting Technical Digest; Dec. 5-7, 1983; pp. 420-423, XP002386761 IEEE, New York, NY.

* cited by examiner

*Primary Examiner* — Kenneth Parker
*Assistant Examiner* — Jose R Diaz
(74) *Attorney, Agent, or Firm* — Stevens & Showalter LLP

(57) ABSTRACT

A DMOS-transistor having enhanced dielectric strength includes a first well region. A highly doped source region is located in the first well region and is complementarily doped thereto. A highly doped bulk connection region is located in the first well region and has the same type of doping as the first well region. A gate electrode and a gate insulation layer for forming a transistor channel are included on a surface of the first well region. The DMOS-transistor further comprises an isolation structure, a highly doped drain doping region, and a second well complementarily doped to the first well region. The second well accommodates the first well region and the drain doping region. A highly doped region is formed at least adjacent to the second well and has the same type of doping as the second well for enhancing the dielectric strength of the highly doped source region.

12 Claims, 1 Drawing Sheet

DMOS-TRANSISTOR HAVING IMPROVED DIELECTRIC STRENGTH OF DRAIN AND SOURCE VOLTAGES

BACKGROUND OF THE INVENTION

1. Field of the Invention

The invention generally relates to DMOS-transistors and the fabrication thereof, wherein an improvement of the electric strength of the source terminal with respect to the substrate is achieved.

2. Description of Related Art

DMOS-transistors have advantages in the circuit application compared to the standard "transistor pair" of n-type high-voltage and p-type high-voltage transistors:

no threshold voltage difference as may typically be encountered in n-type high-voltage and p-type high-voltage transistors, identical on-resistance $R_{on}$, less area consumption in particular compared to p-type high-voltage transistors.

For "smart power" applications it is important that respective technical solutions can be implemented into standard CMOS technology. A DMOS-transistor of this type is for instance described in DE-A 100 63 135.

In particular in applications as a switch at the side connected to the high potential (high side switch) the source-substrate path is stressed with high voltages, wherein the electric strength is limited by the punch-through effect that will then be effective. Depending on the semiconductor material used and depending on the type of doping used a current flow may be caused at this location even at low source-substrate voltages. This current flow significantly restricts the possible applications. Also, the doping used may not be arbitrarily varied. Lightly doped n-wells among others have the advantage to ensure a high electric strength at the drain, wherein, however, the electric strength for the source-substrate path is very low. A more heavily doped n-well guarantees a higher electric strength of the source-substrate path, while however reducing the dielectric break-through strength at the drain. This can be demonstrated by simulation and experiment.

These problems have generated a plurality of solutions. In this respect, DE-A 198 40 402 describes an additional "punch-through" barrier by a boron implantation into the p-well immediately below the n+ source regions. In effect, this compares to a selective doping enhancement of the p-well (p-type body).

According to EP-A 735 591 and U.S. Pat. No. 6,069,034 the punch-through effect is to suppressed by a buried n-doped layer below the n-well. This solution, however, depends on the presence of an epitaxial layer.

According to EP-A 1 220 323 in particular avalanche effects should be reduced by incorporating an additional p-well (buried p-type body), thereby increasing a safe operating area (SOA). As a side effect also the punch-through effect is to be suppressed or is to be shifted towards significantly higher voltages.

With each of these solutions it is a disadvantage that additional process steps have to be implemented in the CMOS process flow. This is accompanied by higher costs, while also increasing the risk of influencing the previous characteristics of process components.

BRIEF SUMMARY OF THE INVENTION

It is an object of the invention to improve the potential for applications, in particular with respect to the electric strength, of DMOS-transistors used or fabricated in CMOS processes, wherein a high degree of compatibility with the CMOS process flow is to maintained.

The technical object is solved in that a DMOS-transistor that is present in a given multi-well CMOS process is changed such that the source-substrate punch-through voltage is significantly increased, substantially without negatively affecting other parameters, in particular the drain break-through voltage. For this purpose process steps included in the CMOS process are used such that a high degree of process compatibility is achieved.

According to the present invention a DMOS-transistor is provided that comprises a first well region, a source region located in the first well region and complementarily highly doped with respect to the first well region and a highly doped bulk connection region located in the first well region and having the same doping as the first well region. The DMOS-transistor further comprises a gate electrode and a gate insulation layer for forming a transistor channel at a surface of the first well region. Furthermore, an isolation structure and a highly doped drain doping regions are provided. Moreover, the DMOS-transistor comprises a second well that is complementarily doped with respect to the first well and in which are positioned the first well region and the drain doping region. Finally, a highly doped region is provided in or adjacent to the second well and has the same doping type in order to enhance the electric strength of the highly doped source region.

In this case it is advantageous that the electric strength at the source of DMOS-transistors is improved by using available method steps of the CMOS technology, while maintaining the electric strength at the drain.

In addition to an insulated p-well also usually two different n-wells are provided in CMOS technology, that is, a lightly doped n-well (sn-well) and a highly doped n-well (or also referred to as a deep n-well: dn-well). By means of the lightly doped n-well the drain extension regions of the n-type high-voltage transistors are formed, among others, and also field effect transistors and certain bipolar transistors are formed by means of this lightly doped n-well. The deep doped well is necessarily provided due to the vertical insulation of p-channel high-voltage transistors. Hence, due to the inventive structure of the DMOS-transistor a high electric strength of the source-substrate path may be achieved, wherein conventional manufacturing techniques of CMOS technology are used.

In a further preferred embodiment the highly doped region is formed below the second well. Hence, an efficient shielding of portions of the second well and in particular of the source region may be accomplished.

In a further preferred embodiment the highly doped region is located at least in a perpendicular direction below the highly doped source region. In this way the electric strength may be enhanced in a very efficient manner.

In a further embodiment a portion of the second well is located in a perpendicular direction below the highly doped source region and is highly doped corresponding to the doping type of the second well and forms at least a part of the highly doped region. In this manner the formation of the highly doped region may efficiently be associated with implantation methods for forming the second well.

In a further preferred embodiment the first well is p-doped, while in other embodiments the first well is n-doped. Hence, n-channel and p-channel transistors with high electric strength may be fabricated in an efficient manner.

In a further embodiment the isolation structure is provided as a field oxide such that a high degree of compatibility with respect to common CMOS techniques is possible. Furthermore, the gate electrode may comprise polysilicon, as is typical in CMOS techniques.

In a further embodiment the gate insulation layer may comprise the gate oxide as is well-approved in many CMOS techniques.

In a further preferred embodiment the lateral extension of the highly doped region is less than the lateral extension of the first well. In this manner an efficient shielding of the source region is achieved, wherein nevertheless the influence of the highly doped region on other device regions is very low.

A method for forming a DMOS-transistor is also proposed, wherein the method comprises the following steps:
a) forming a first well region and a second well region with mutually complementary doping type by means of CMOS compatible processes;
b) forming a highly doped region in or adjacent to the second well region that has the same doping type as the second well region for enhancing the electric strength of a highly doped source region to be formed;
c) forming an isolation structure;
d) forming a gate electrode structure and a gate insulation layer for forming a transistor channel on a surface of the first well region;
e) forming a highly doped source region located in the first well region and complementarily doped with respect to the first well region and forming a highly doped drain doping region located in the second well region and
f) forming a highly doped bulk connection region located in the first well region and having the same doping type.

In this manner the above-described DMOS-transistor may be formed in a very compatible manner with respect to CMOS techniques.

In a further preferred embodiment also the steps c) to f) are also performed according to a CMOS compatible process flow, wherein the step b) is performed without requiring a modification of the steps c) to f).

In this way the compatibility with existing CMOS technologies may further be increased so that substantially no changes in existing CMOS steps are required. The invention was tested in given automotive CMOS processes and resulted in the following improvements:

| Parameter | Standard-DMOS | Claims 1, 11 |
| --- | --- | --- |
| voltage: source-substrate | 15 . . . 20 Volt | greater than 90 Volt |
| voltage: drain | greater than 80 Volt | greater than 80 Volt |

BRIEF DESCRIPTION OF THE SEVERAL VIEWS OF THE DRAWINGS

The invention will be described by means of illustrative embodiments referring to the drawings.

DETAILED DESCRIPTION OF THE INVENTION

Figure 1:
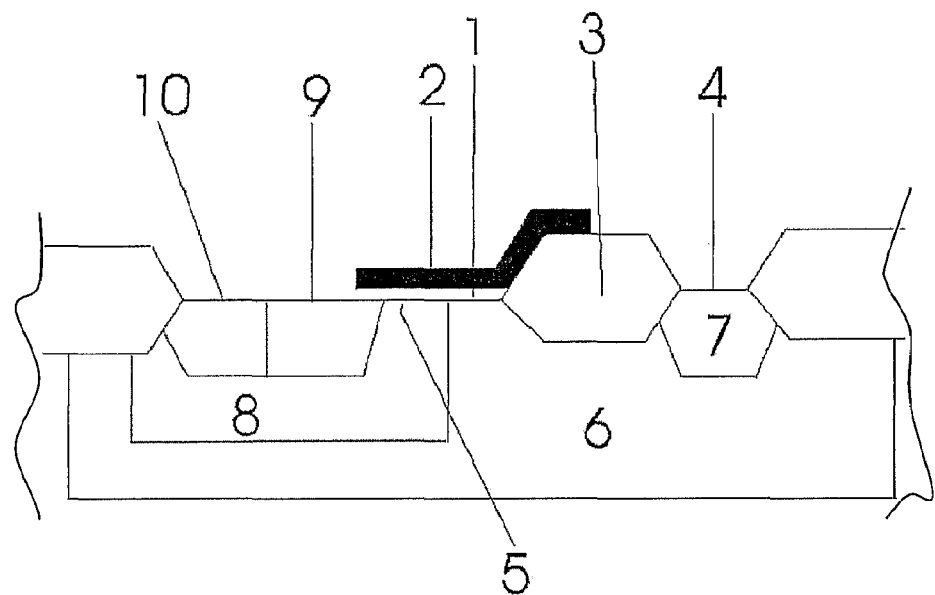
FIG. 1 schematically illustrates the structure of a known standard DMOS-transistor.

With reference to FIG. 1 a conventional DMOS-transistor will be described first. A lightly doped n-well 6 formed in a substrate that is not shown accommodates a p-well 8 that is also referred to as transistor bulk. A highly $n^+$-doped source region and a highly $p^+$-doped bulk connection region are formed in the p-well 8. Moreover, a field oxide 3 is provided in the lightly doped n-well 6, followed by a highly $n^+$-doped drain region, which in turn is connected to a respective terminal 4. Furthermore, a polysilicon gate 2 is provided above the lightly doped n-well 6 so as to overlap with the p-well 8, wherein a gate oxide 1 is provided as an insulation layer such that upon application of an appropriate control voltage to the polysilicon gate 2 a transistor channel 5 may build up.

Figure 2:
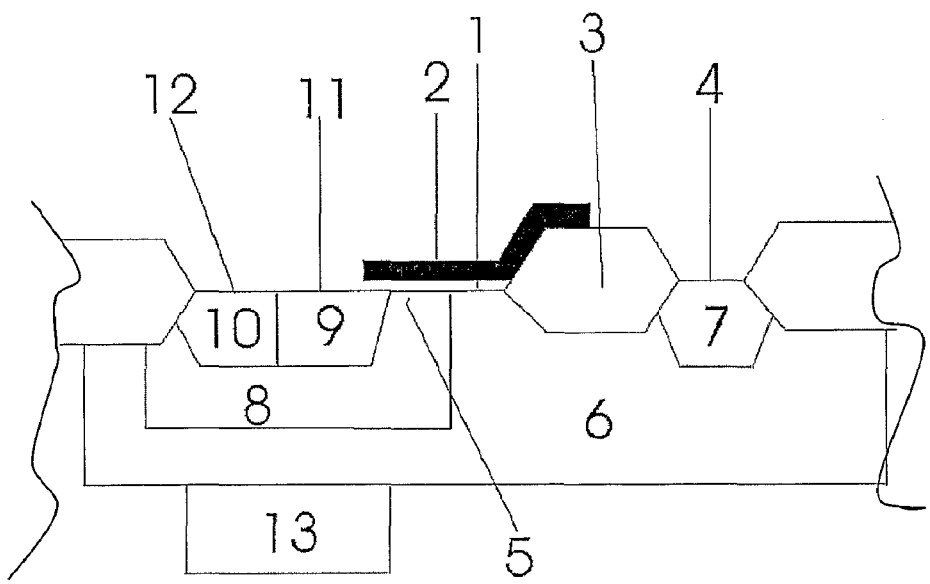
FIG. 2 likewise illustrates a schematic view of a structure of the modified DMOS-transistor.

FIG. 2 depicts a cross-sectional view similar to FIG. 1, wherein, however, here inventive measures are provided to significantly improve the electric strength of the source compared to the conventional structure as shown in FIG. 1.

The DMOS-transistor of FIG. 2 comprises a first well 8 having a specified doping type, for instance an n-type doping or a p-type doping, and further comprises a second lightly doped well 6 having a doping type that is complementary to the well 8. Moreover, in the lightly doped well 6 a highly doped drain region 7 is provided that has the same type of doping as the lightly doped well 6. Furthermore, a complementarily and highly doped source region 9 including a respective terminal 11 and a bulk terminal doping with a high doping level and the same type of doping as the first well 8 and including a respective transistor bulk terminal 12 are provided in the first well region 8. Moreover, an isolation structure 3 is formed between the drain region 7 and the source region 9. Additionally, a gate electrode 2 preferably comprised of polysilicon is formed on a respective gate insulation layer 1 so that upon application of an appropriate control voltage to the gate electrode 2 a corresponding transistor channel 5 may form. Also, a region 13 of higher dopant concentration of the same type of doping as the well region 6 is provided adjacent to, and in one advantageous embodiment in contact with, the second well region 6 or in the second well region 6, in order to increase the electric strength of the source region 9 with respect to the substrate that is not shown.

In particular, the highly doped region 13 may be provided as a well region adjacent to the second well region 6. In the embodiment shown the highly doped region 13 is positioned below the lightly doped second well 6 in a direction perpendicular below the source region 9. The size of the highly doped region 13 for obtaining the desired effect may be determined by simulation and/or experiment, since the electrical parameters may be influenced by the actual dimensions and the actual doping profiles.

In one advantageous embodiment the remaining components of the inventive DMOS-transistor may be maintained in the same way as in the conventional design of FIG. 1, thereby not requiring any modifications of CMOS processes of already existing design criteria and of the further characteristics of a DMOS-transistor.

The DMOS-transistor shown in FIG. 2 may be substantially fabricated by CMOS compatible processes, which include the formation of the first and second wells 8, 6 and the isolation structure 3, the gate insulation layer 1 and the gate electrode 2. Moreover, the highly doped region 13 may be formed by an appropriate ion implantation or other techniques, wherein this may be accomplished prior to forming the highly doped regions 10, 9 and 7. Therefore, the influence on these subsequently formed regions is low and thus negligible. Thereafter, the highly doped regions 10, 9 and 7 may be formed. In other embodiments, in which the lateral extension of the highly doped region 13 is not necessarily adjusted so as to be less than for instance the lateral extension of the first well region 8, as shown in FIG. 2, a respective additional doping of the second well 6 may be performed while forming the same, or respective additional doping processes may be performed prior to or after forming the well 6.

In order to adjust the required lateral extension of the highly doped region 13 a corresponding resist mask may be formed such that the size of the highly doped region 13 is adjustable depending on the specific application, without significantly affecting subsequent processes and components.

As explained above, respective further parameters, such as the implantation energy and the dose, may be adjusted in relation to results of simulation calculations and/or experiments so as to obtain the desired shielding effect.

In a further embodiment a DMOS-transistor is provided that consists of: the p-well region 8 (transistor bulk), in which are provided the n$^+$-doped source region 9 and the p$^+$-doped bulk connection region 10 and on a surface of which the transistor channel 5 builds up by means of the gate oxide 1 and polysilicon gate 2; the field oxide 3 and the n$^+$ drain doping region 7, wherein the p-well region 8 and the n$^+$ drain doping region 7 are located in the lightly doped n-well 6, wherein a highly n-doped well region 13 (dn well) is formed below the lightly doped n-well region 6 in the direction perpendicular below the n$^+$-doped source region 9.

In a further embodiment of the above DMOS-transistor a part of the lightly doped n-well 6 located perpendicularly below the n$^+$-doped source region 9 is highly n-doped at the boundary to the initial material.

In a further embodiment of the above DMOS-transistor it comprises an equivalent arrangement of the various partial structures, wherein the doping with respect to the individual doped regions is complementary compared to two embodiments described above.

It may be summarized that the additional incorporation of a highly doped region, such as the region 13, below the lightly doped well 6 is effectively the same as a selective additional doping of the lightly doped well 6.

The regions shown in FIGS. 1 and 2 may be subjected to a complementary doping, respectively, so as to provide a respective complementary DMOS-transistor device.

REFERENCE SIGNS 1 gate insulation layer
2 gate electrode
3 field oxide
4 connection
5 transistor channel

The invention claimed is:

1. A method for forming a DMOS-transistor comprising:
   providing a substrate;
   forming a first well region and a second well region by CMOS compatible processes in said substrate, said first and second well regions having complementary types of doping;
   forming a highly doped region with the same type of doping as the second well region, said highly doped region being at least adjacent to said second well region, wherein a lateral extension of the highly doped region is less than a lateral extension of the first well region for increasing an electric strength of a highly doped source region to be formed; and thereafter forming an isolation structure;
   forming a gate electrode and a gate insulation layer for forming a transistor channel on a surface of said first well region;
   forming a highly doped source region located in said first well region and complementarily doped thereto and forming a highly doped drain doping region located in said second well region; and
   forming a highly doped bulk connection region located in said first well region and having the same type of doping as said first well region.

2. The method for forming a DMOS-transistor of claim 1, wherein forming an isolation structure, forming a gate electrode and a gate insulation layer, forming a highly doped source region, forming a highly doped drain doping region, and forming a highly doped bulk connection region are performed according to a CMOS compatible process flow and wherein forming a highly doped region is performed without modification of forming an isolation structure, forming a gate electrode and a gate insulation layer, forming a highly doped source region, forming a highly doped drain doping region, and forming a highly doped bulk connection region.

3. The method for forming a DMOS-transistor of claim 1, wherein the highly doped region is formed adjacent to the second well region.

4. The method of claim 1, wherein the highly doped region is in said second well region.

5. The method of claim 1, wherein said highly doped region is formed below said second well region.

6. The method of claim 1, wherein said highly doped region is located at least in a direction perpendicularly below said highly doped source region.

7. The method of claim 1, wherein a part of said second well region is highly doped with a type of doping corresponding to the doping of said second well region and is formed in a direction perpendicularly below said highly doped source region and forms at least part of the highly doped region.

8. The method of claim 1, wherein the isolation structure is represented by a field oxide.

9. The method of claim 1, wherein the gate electrode comprises polysilicon.

10. The method of claim 1, wherein the gate insulation layer comprises a gate oxide.

11. The method of claim 1, wherein said highly doped region formed at least adjacent to said second well and having the same type of doping has at least a portion formed within said second well.

12. A DMOS-transistor having improved dielectric strength produced by:
   providing a substrate;
   forming a first well region and a second well region by CMOS compatible processes in said substrate, said first and second well regions having complementary types of doping;
   forming a highly doped region with the same type of doping as the second well region, said highly doped region being at least one of in said second well region and adjacent to said second well region, wherein a lateral extension of the highly doped region is less than a lateral extension of the first well; and thereafter
   forming an isolation structure;
   forming a gate electrode and a gate insulation layer for forming a transistor channel on a surface of said first well region;
   forming a highly doped source region located in said first well region and complementarily doped thereto and forming a highly doped drain doping region located in said second well region; and
   forming a highly doped bulk connection region located in said first well region and having the same type of doping as said first well region.

* * * * *